(12) United States Patent
Sun et al.

(10) Patent No.: US 6,887,804 B2
(45) Date of Patent: *May 3, 2005

(54) PASSIVATION PROCESSING OVER A MEMORY LINK

(75) Inventors: Yunlong Sun, Beaverton, OR (US); Robert F. Hainsey, Portland, OR (US); Lei Sun, Aloha, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/361,206

(22) Filed: Feb. 7, 2003

(65) Prior Publication Data

US 2003/0222330 A1 Dec. 4, 2003

Related U.S. Application Data

(63) Continuation-in-part of application No. 10/322,347, filed on Dec. 17, 2002, which is a continuation-in-part of application No. 09/757,418, filed on Jan. 9, 2001, now Pat. No. 6,574,250.
(60) Provisional application No. 60/355,151, filed on Feb. 8, 2002, provisional application No. 60/341,744, filed on Dec. 17, 2001, provisional application No. 60/223,533, filed on Aug. 4, 2000, and provisional application No. 60/175,337, filed on Jan. 10, 2000.

(51) Int. Cl.$^7$ ............................................... H01L 21/82
(52) U.S. Cl. .................... 438/940; 438/130; 219/121.6; 219/121.66; 219/121.69; 219/121.67
(58) Field of Search .................. 219/121.6, 121.61, 219/121.65, 121.66, 121.67, 121.68, 121.69, 121.76, 121.77; 438/130, 132, 940; 372/10, 25, 29.021

(56) References Cited

U.S. PATENT DOCUMENTS

| | | | |
|---|---|---|---|
| 4,114,018 A | 9/1978 | Von Allmen et al. | 219/121 LM |
| 4,414,059 A | 11/1983 | Blum et al. | 156/659.1 |
| 4,646,308 A | 2/1987 | Kafka et al. | 372/25 |

(Continued)

OTHER PUBLICATIONS

Time–Bandwidth Products, *Integrated Nd YAG or Nd: YLF Picosecond Regenerative Amplifier System*, Feb. 2000.
Spectra–Physics, *TSUNAMI, The First Choice in Mode–Locked Ti:Sapphire Lasers*.
Spectra–Physics, *OPAL, The First Synchronously Pumped Optical Parameiric Oscillator*.
Spectra–Physics, *Mai Tai, The First Tunable One–Box Ti:Sapphire Femtosecond Laser Source*.
U.S. Appl. No. 60/034,232, filed Jan. 6, 1997 (See reference AE, corresponding nonprovisional).

*Primary Examiner*—Tom Thomas
*Assistant Examiner*—Matthew C. Landau
(74) *Attorney, Agent, or Firm*—Stoel Rives LLP

(57) ABSTRACT

A set (50) of one or more laser pulses (52) is employed to remove passivation layer (44) over a conductive link (22). The link (22) can subsequently be removed by a different process such as chemical etching. The duration of the set (50) is preferably shorter than 1,000 ns; and the pulse width of each laser pulse (52) within the set (50) is preferably within a range of about 0.05 ps to 30 ns. The set (50) can be treated as a single "pulse" by conventional laser positioning systems (62) to perform on-the-fly material removal without stopping whenever the laser system (60) fires a set (50) of laser pulses (52) at each target area (51). Conventional wavelengths in the IR range or their harmonics in the green or UV range can be employed.

79 Claims, 6 Drawing Sheets

U.S. PATENT DOCUMENTS

| | | | |
|---|---|---|---|
| 4,780,177 A | 10/1988 | Wojnarowski et al. | 156/643 |
| 4,932,031 A | 6/1990 | Alfano et al. | 372/41 |
| 5,034,951 A | 7/1991 | Edelstein et al. | 372/22 |
| 5,042,040 A | 8/1991 | Harvey et al. | 372/18 |
| 5,175,664 A | 12/1992 | Diels et al. | 361/213 |
| 5,208,437 A | 5/1993 | Miyauchi et al. | 219/121.67 |
| 5,236,551 A | 8/1993 | Pan | 156/643 |
| 5,329,152 A | 7/1994 | Janai et al. | 257/529 |
| 5,473,624 A | 12/1995 | Sun | 372/69 |
| 5,513,194 A | 4/1996 | Tamura et al. | 372/6 |
| 5,520,679 A | 5/1996 | Lin | 606/5 |
| 5,539,764 A | 7/1996 | Shields et al. | 372/57 |
| 5,558,789 A | 9/1996 | Singh | 219/121.69 |
| 5,586,138 A | 12/1996 | Yokoyama | 372/97 |
| 5,627,848 A | 5/1997 | Fermann et al. | 372/18 |
| 5,656,186 A | 8/1997 | Mourou et al. | 219/121.69 |
| 5,720,894 A | 2/1998 | Neev et al. | 216/65 |
| 5,725,914 A | 3/1998 | Opower | 427/592 |
| 5,742,634 A | 4/1998 | Rieger et al. | 372/25 |
| 5,751,585 A | 5/1998 | Cutler et al. | 364/474.03 |
| 5,786,560 A | 7/1998 | Tatah et al. | 219/121.77 |
| 5,811,751 A | 9/1998 | Leong et al. | 219/121.6 |
| 5,848,080 A | 12/1998 | Dahm | 372/25 |
| 5,953,354 A | 9/1999 | Staver et al. | 372/18 |
| 5,956,354 A | 9/1999 | Yan | 372/18 |
| 5,987,049 A | 11/1999 | Weingarten et al. | 372/70 |
| 5,998,759 A | 12/1999 | Smart | 219/121.69 |
| 6,025,256 A | 2/2000 | Swenson et al. | 438/601 |
| 6,057,180 A | 5/2000 | Sun et al. | 438/132 |
| 6,281,471 B1 | 8/2001 | Smart | 219/121.62 |
| 6,727,458 B2 * | 4/2004 | Smart | 219/121.62 |
| 2001/0009250 A1 | 7/2001 | Herman et al. | 219/121.69 |
| 2001/0050931 A1 | 12/2001 | Iso | 372/25 |
| 2002/0003130 A1 | 1/2002 | Sun et al. | 219/121.68 |

* cited by examiner

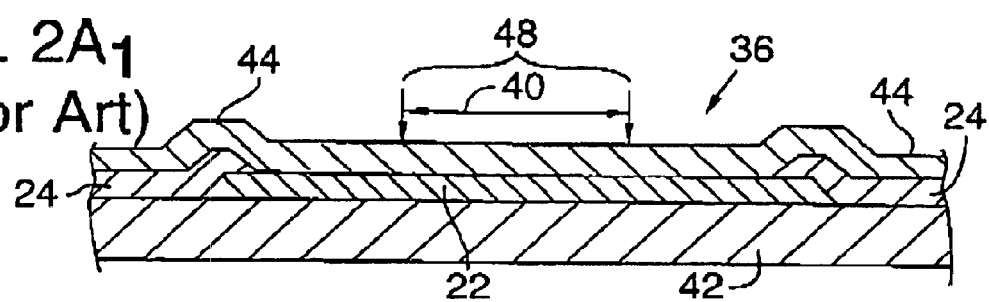
FIG. 2A₁ (Prior Art)

US 6,887,804 B2

PASSIVATION PROCESSING OVER A MEMORY LINK

RELATED APPLICATIONS

This patent application derives priority from U.S. Provisional Application No. 60/355,151, filed Feb. 8, 2002; is a continuation-in-part of U.S. patent application Ser. No. 10/322,347, filed Dec. 17, 2002, which claims priority from U.S. Provisional Application No. 60/341,744, filed Dec. 17, 2001; and is a continuation-in-part of U.S. patent application Ser. No. 09/757,418, filed Jan. 9, 2001 U.S. Pat. No. 6,574,250, which claims priority from both U.S. Provisional Application No. 60/223,533, filed Aug. 4, 2000 and U.S. Provisional Application No. 60/175,337, filed Jan. 10, 2000.

TECHNICAL FIELD

The present invention relates to processing of memory or other IC links and, in particular, to a laser system and method employing a one or more fast laser pulses to remove the passivation over an IC link on-the-fly so that it can be subsequently etched.

BACKGROUND OF THE INVENTION

Yields in IC device fabrication processes often incur defects resulting from alignment variations of subsurface layers or patterns or particulate contaminants. FIGS. 1, 2A, and 2B show repetitive electronic circuits 10 of an IC device or work piece 12 that are commonly fabricated in rows or columns to include multiple iterations of redundant circuit elements 14, such as spare rows 16 and columns 18 of memory cells 20. With reference to FIGS. 1, 2A, and 2B, circuits 10 are also designed to include particular laser severable conductive links 22 between electrical contacts 24 that can be removed to disconnect a defective memory cell 20, for example, and substitute a replacement redundant cell 26 in a memory device such as a DRAM, an SRAM, or an embedded memory. Similar techniques are also used to sever links 22 to program a logic product, gate arrays, or ASICs.

Links 22 are about 0.3–2 microns ($\mu$m) thick and are designed with conventional link widths 28 of about 0.4–2.5 $\mu$m, link lengths 30, and element-to-element pitches (center-to-center spacings) 32 of about 2–8 $\mu$m from adjacent circuit structures or elements 34, such as link structures 36. Although the most prevalent link materials have been polysilicon and like compositions, memory manufacturers have more recently adopted a variety of more conductive metallic link materials that may include, but are not limited to, aluminum, copper, gold, nickel, titanium, tungsten, platinum, as well as other metals, metal alloys, metal nitrides such as titanium or tantalum nitride, metal silicides such as tungsten silicide, or other metal-like materials.

Circuits 10, circuit elements 14, or cells 20 are tested for defects, the locations of which may be mapped into a database or program. Traditional 1.047 $\mu$m or 1.064 $\mu$m infrared (IR) laser wavelengths have been employed for more than 20 years to explosively remove conductive links 22. Conventional memory link processing systems focus a single pulse of laser output having a pulse width of about 4 to 30 nanoseconds (ns) at a selected link 22. FIGS. 2A and 2B show a laser spot 38 of spot size (area or diameter) 40 impinging a link structure 36 composed of a polysilicon or metal link 22 positioned above a silicon substrate 42 and between component layers of a passivation layer stack including an overlying passivation layer 44 (shown in FIG. 2A but not in FIG. 2B), which is typically 500–10,000 angstrom (Å) thick, and an underlying passivation layer 46. Silicon substrate 42 absorbs a relatively small proportional quantity of IR laser radiation, and conventional passivation layers 44 and 46 such as silicon dioxide or silicon nitride are relatively transparent to IR laser radiation. The links 22 are typically processed "on-the-fly" such that the beam positioning system does not have to stop moving when a laser pulse is fired at a selected link 22, with each link 22 being processed by a single laser pulse. The on-the-fly process facilitates a very high link-processing throughput, such as processing several tens of thousands of links 22 per second.

FIG. 2C is a fragmentary cross-sectional side view of the link structure of FIG. 2B after the link 22 is removed by the prior art laser pulse. To avoid damage to the substrate 42 while maintaining sufficient laser energy to process a metal or nonmetal link 22, Sun et al. in U.S. Pat. No. 5,265,114 and U.S. Pat. No. 5,473,624 proposed using a single 9 to 25 ns laser pulse at a longer laser wavelength, such as 1.3 $\mu$m, to process memory links 22 on silicon wafers. At the 1.3 $\mu$m, wavelength, the laser energy absorption contrast between the link material and silicon substrate 20 is much larger than that at the traditional 1 $\mu$m laser wavelengths. The much wider laser processing window and better processing quality afforded by this technique has been used in the industry for about five years with great success.

The 1 $\mu$m and 1.3 $\mu$m laser wavelengths have disadvantages however. The energy coupling efficiency of such IR laser beams 12 into a highly electrically conductive metallic link 22 is relatively poor; and the practical achievable spot size 40 of an IR laser beam for link severing is relatively large and limits the critical dimensions of link width 28, link length 30 between contacts 24, and link pitch 32. This conventional laser link processing relies on heating, melting, and evaporating link 22, and creating a mechanical stress build-up to explosively open overlying passivation layer 44 with a single laser pulse. Such a conventional link processing laser pulse creates a large heat affected zone (HAZ) that could deteriorate the quality of the device that includes the severed link. For example, when the link is relatively thick or the link material is too reflective to absorb an adequate amount of the laser pulse energy, more energy per laser pulse has to be used. Increased laser pulse energy increases the damage risk to the IC chip. However, using a laser pulse energy within the risk-free range on thick links often results in incomplete link severing.

U.S. Pat. No. 6,057,180 of Sun et al. describes a method of using ultraviolet (UV) laser output to sever links with the benefit of a smaller beam spot size. However, removal of the link itself by such a UV laser pulse entails careful consideration of the underlying passivation structure and material to protect the underlying passivation and silicon wafer from being damaged by the UV laser pulse.

U.S. Pat. No. 5,329,152 of Janai et al. describes coating a metal layer with a laser absorbing resist material (and an anti-reflective material), blowing away the coatings with a high-powered YAG, excimer, or pulsed laser diode with fluences of 0.2–10 J/cm$^2$ at a 350-nm wavelength, and then etching the uncovered metal with a chemical or plasma etch process. In an alternative to blowing away the resist, Janai describes using laser pulses that travel through a resist material so that the laser pulses can react with the underlying metal and integrate it into the resist material to make the resist material etchable along with the metal (and/or partially blowing away the resist material).

U.S. Pat. No. 5,236,551 of Pan teaches providing metalization portions, covering them with a photoabsorptive polymeric dielectric, ablating the dielectric to uncover portions of the metal, etching the metal, and then coating the resulting surface with a polymeric dielectric. Pan discloses only excimer lasers having wavelengths of less than 400 nm and relies on a sufficiently large energy fluence per pulse (10 mJ/cm$^2$ to 350 mJ/cm$^2$) to overcome the ablative photodecomposition threshold of the polymeric dielectric.

U.S. Pat. No. 6,025,256 of Swenson et al. describes methods of using ultraviolet (UV) laser output to expose or ablate an etch protection layer, such as a resist or photoresist, coated over a link that may also have an overlying passivation material, to permit link removal (and removal of the overlying passivation material) by different material removal mechanisms, such as by chemical etching. This process enables the use of an even smaller beam spot size. However, expose and etch removal techniques employ additional coating steps and additional developing and/or etching steps. The additional steps typically entail sending the wafer back to the front end of the manufacturing process for extra step(s).

U.S. Pat. No. 5,656,186 of Mourou et al. discloses a general method of laser induced breakdown and ablation at several wavelengths by high repetition rate ultrafast laser pulses, typically shorter than 10 ps, and demonstrates creation of machined feature sizes that are smaller than the diffraction limited spot size.

U.S. Pat. No. 5,208,437 of Miyauchi et al. discloses a method of using a single "Gaussian"-shaped pulse of a subnanosecond pulse width to process a link.

U.S. Pat. No. 5,742,634 of Rieger et al. discloses a simultaneously Q-switched and mode-locked neodymium (Nd) laser device with diode pumping. The laser emits a series of pulses each having a duration time of 60 to 300 picoseconds (ps), under an envelope of a time duration of 100 ns.

SUMMARY OF THE INVENTION

An object of the present invention is to provide a method or apparatus for improving the processing quality for removal of IC links.

Another object of the invention is to process the passivation layer above a link with a set of one or more low energy laser pulses.

A further object of the invention is to provide a method and apparatus for employing a much smaller laser beam spot size for link processing.

Yet another object of the invention is to deliver such sets of laser pulses to process the passivation layer on-the-fly.

Still another object of the invention is to avoid or minimize substrate damage and undesirable damage to the passivation structure.

Still another object of the invention is to avoid numerous extra processing steps while removing links with an alternative method to that of explosive laser blowing.

In International Publication No. WO 01/51243, published on Jul. 19, 2001, and U.S. Publication No. 2002-0003130 A1, published Jan. 10, 2002, a burst of ultrashort laser pulses is employed to sever a conductive link in a substantially nonthermal manner that offers a wider processing window, eliminates undesirable HAZ effects, and achieves superior severed link quality. The duration of the burst is preferably in the range of 10 ns to 500 ns; and the pulse width of each laser pulse within the burst is generally shorter than 25 ps, preferably shorter than or equal to 10 ps, and most preferably about 10 ps to 100 fs or shorter. The burst can be treated as a single "pulse" by conventional laser positioning systems to perform on-the-fly link removal without stopping whenever the laser system fires a burst of laser pulses at each selected link.

The present invention employs laser output including set of one or more laser pulses, each with a laser pulse energy in a very safe range, to remove or "open" a target area of passivation layer 44 overlying a target IC link 22 such that the target link 22 is exposed and then can be etched by a separate process and such that the passivation layer 46 and silicon wafer 42 underlying the link 22 are not subjected to the amount of laser output energy used in a traditional link-processing technique. The pulse width of each laser pulse within the set is generally shorter than 30 ns, preferably in the range of 0.05 ps to 5 ns, and more preferably shorter than 10 ps. Each laser pulse within the set has an energy or peak power per pulse that is less than the damage threshold for the substrate 42 supporting the link structure. The number of laser pulses in the set is controlled such that the laser output cleans off the bottom of the passivation layer 44, but leaves at least some of the link 22 such that the underlying passivation layer 46 and the substrate 42 are not subjected to the laser energy induced damage and are completely intact.

The duration of a set having at least one laser pulse is shorter than 1,000 ns, more preferably shorter than 500 ns, and most preferably shorter than 300 ns, and preferably in the range of 5 to 300 ns. Because the whole duration of the set is shorter than 1,000 ns, the set is considered to be a single "pulse" by a traditional link-severing laser positioning system. This practice does not, therefore, entail either a long dwell time or separate duplicative scanning passes of repositioning and refiring at each selected link that would effectively reduce the throughput by factor of about two or more. The laser spot of each of the pulses in the set encompasses the link width and the displacement between the laser spots of each pulse is less than the positioning accuracy of a typical positioning system, which is typically +−0.05 to 0.2 $\mu$m. Thus, the laser system can still process the target areas of the passivation layer 44 overlying the target links 22 on-the-fly, i.e. the positioning system does not have to stop moving when the laser system fires a set of laser pulses at a target area of passivation layer 44 over each selected link 22.

After the passivation layer 44 is removed above all of the links 22 that are to be severed, chemical etching can be employed to cleanly clear the exposed link 22 without the debris, splash, or other common material residue problems that plague direct laser link severing. Because the set of laser pulses ablates only the overlying passivation layer 44 and the whole link 22 is not heated, melted, nor vaporized, there is no opportunity to thermally or physically damage connected or nearby circuit structures or to cause cracks in the underlying passivation layer 46 or the neighboring overlying passivation layer 44. Chemical etching of the links 22 is also relatively indifferent to variations in the link structures 36 from work piece 12 to work piece 12, such as the widths 28 and thicknesses of the links 22, whereas conventional link processing parameters should be tailored to suit particular link structure characteristics. The chemical etching of the links 22 entails only a single extra process step that can be performed locally and/or in-line such that the work pieces 12 need not be sent back to the front end of the processing line to undergo the etching step.

In one embodiment, a continuous wave (CW) mode-locked laser at high laser pulse repetition rate, followed by optical gate and an amplifier, generates sets having one or more ultrashort laser pulses that are preferably from about 100 fs to about 10 ps. In another one embodiment, a Q-switched and CW mode-locked laser generates sets having ultrashort laser pulses that are preferably from about 100 fs to about 10 ps. Because each laser pulse within the set is ultrashort, its interaction with the target materials (passivation layers and metallic link) is substantially not thermal. Each laser pulse breaks off a thin sublayer of about 100–2,000 Å of material, depending on the laser energy or peak power, laser wavelength, and type of material, until the passivation layer 44 over the link 22 is removed. This substantially nonthermal process may mitigate certain irregular and inconsistent link processing quality associated with thermal-stress explosion behavior of passivation layers 44 of links 22 with widths narrower than about 1 μm or links 22 thicker (depthwise) than about 1 μm. In addition to the "nonthermal" and well-controllable nature of ultrashort-pulse laser processing, the most common ultrashort-pulse laser source emits at a wavelength of about 800 nm and facilitates delivery of a small-sized laser spot. Thus, the process may facilitate greater circuit density.

In another embodiment, the sets have one or more laser pulses that are preferably from about 25 ps to about 20 ns or 30 ns. These sets of laser pulses can be generated from a CW mode-locked laser system including an optical gate and an optional down stream amplifier or from two or more synchronized but offset lasers that share a portion of an optical path.

Additional objects and advantages of this invention will be apparent from the following detailed description of preferred embodiments which proceeds with reference to the accompanying drawings.

BRIEF DESCRIPTION OF THE DRAWINGS

FIG. 2A and FIG. 2A1 are fragmentary cross-sectional side views of a conventional, large semiconductor link structures, respectively with and without an underlying passivation layer, receiving a laser pulse characterized by a prior art pulse parameters.

DETAILED DESCRIPTION OF PREFERRED EMBODIMENTS

Figure 1:
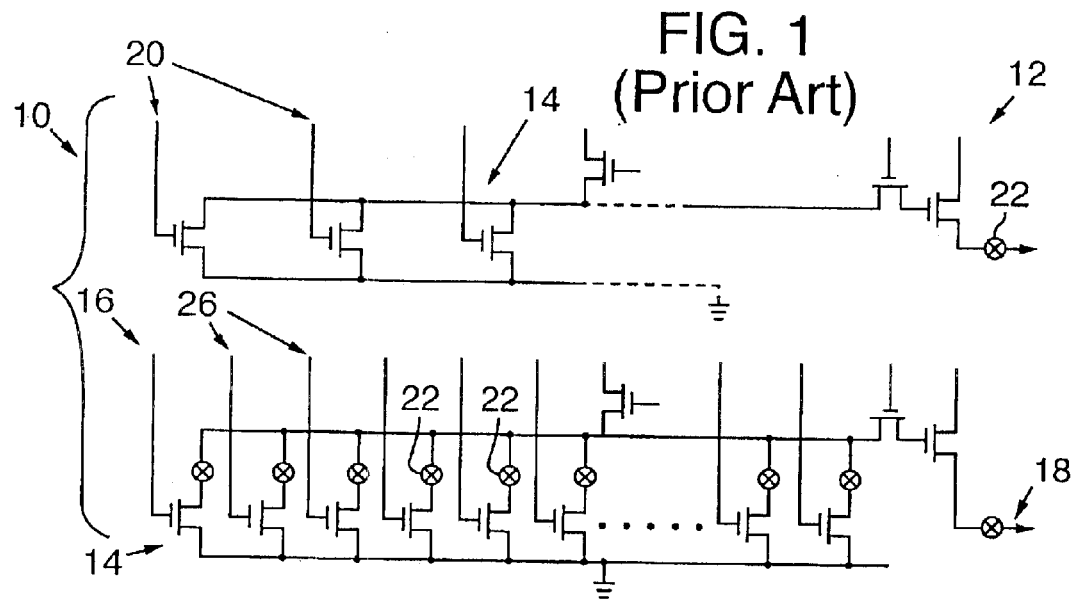
FIG. 1 is a schematic diagram of a portion of a DRAM showing the redundant layout of and programmable links in a spare row of generic circuit cells.
Figure 2A:
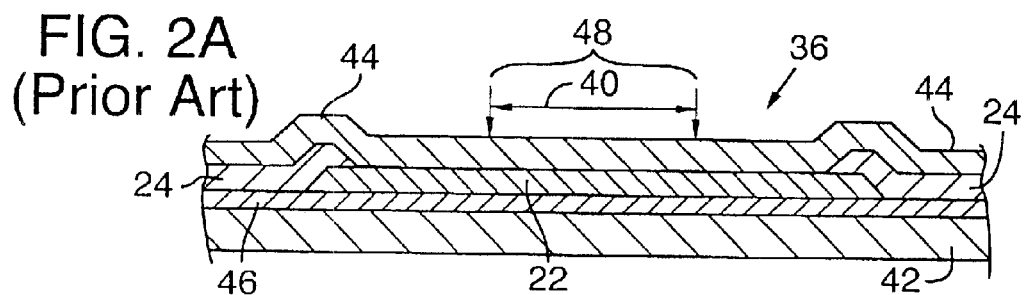
Figure 2B:
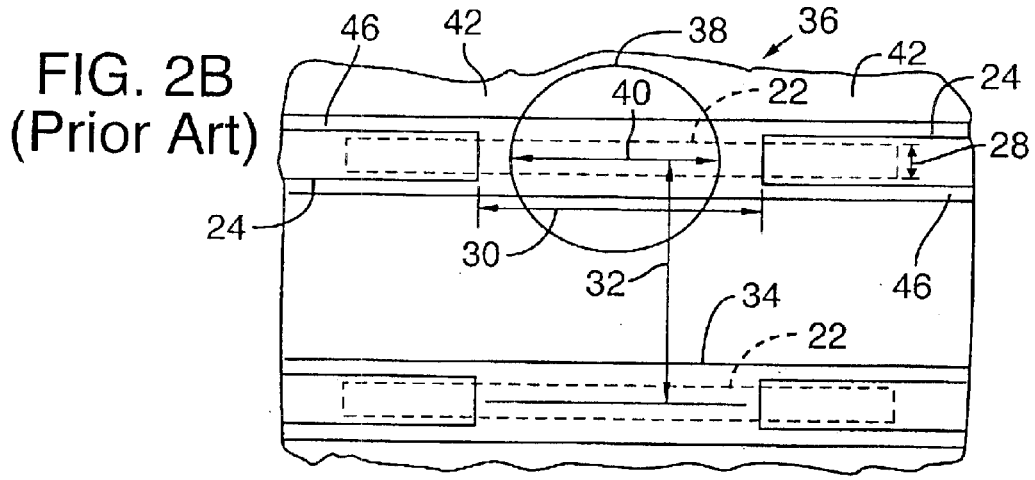
FIG. 2B is a fragmentary top view of the link structure and the laser pulse of FIG. 2A, together with an adjacent circuit structure.
Figure 3A:
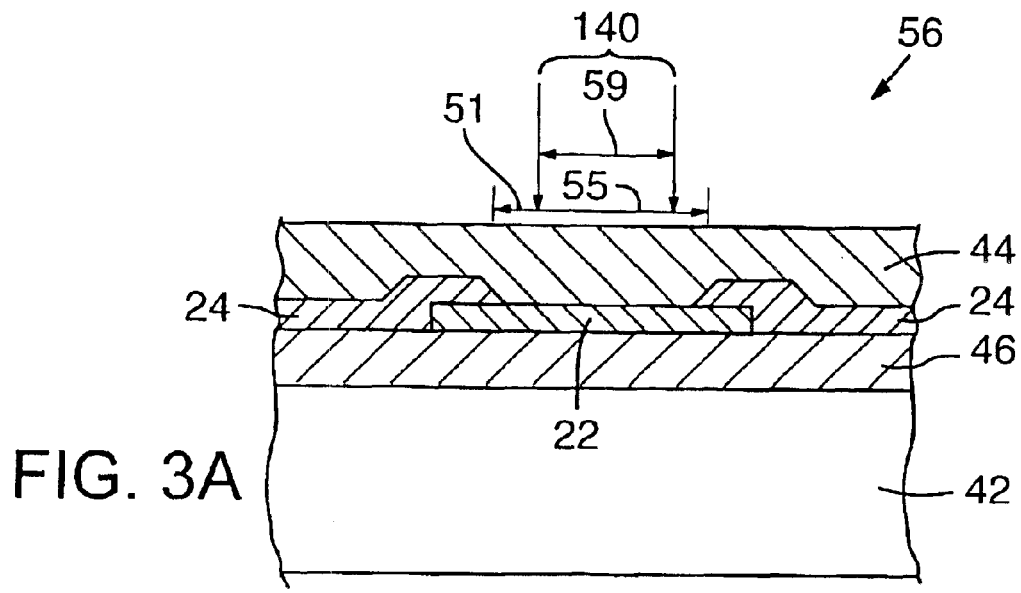
FIG. 3A is a fragmentary cross-sectional side view of a target structure, covered by a passivation layer, receiving a laser output characterized by laser output parameters in accordance with the present invention.
Figure 3B:
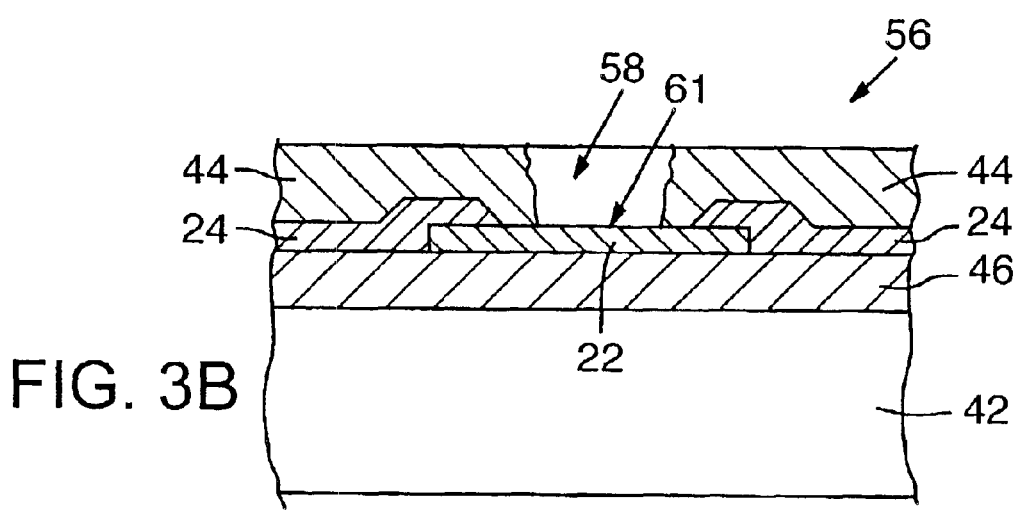
FIG. 3B. is a fragmentary cross-sectional side view of the target structure of FIG. 3A subsequent to a passivation-removing laser processing step.
Figure 3C:
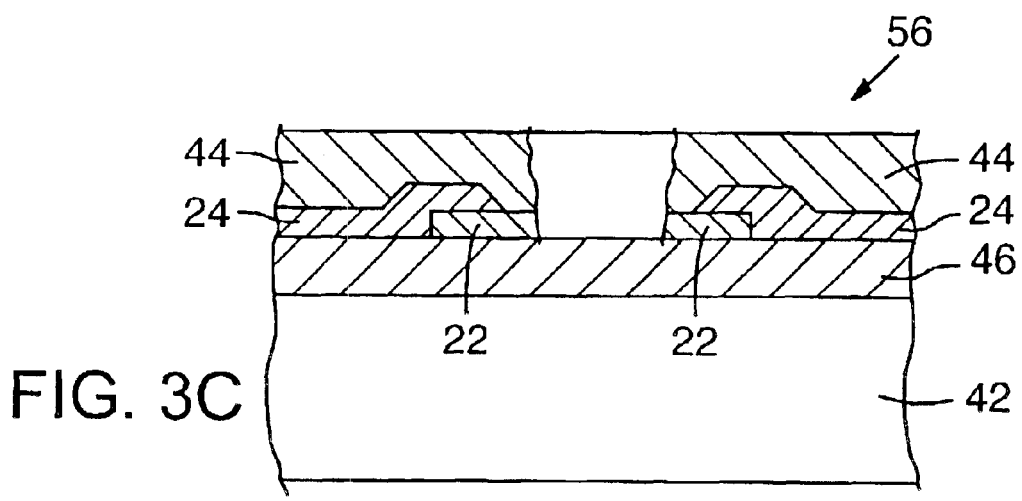
FIG. 3C is a fragmentary cross-sectional side view of the target structure of FIG. 3B subsequent to an etch processing step.

FIGS. 3A, 3B, and 3C (collectively FIG. 3) are fragmentary cross-sectional side views of target structure 56 undergoing sequential stages of target processing in accordance with the present invention. Target structure 56 can have dimensions as large as or smaller than those blown by laser spots 38 of conventional link-blowing laser output 48. For convenience, certain features of target structure 56 that correspond to features of target structure 36 of FIG. 2A have been designated with the same reference numbers.

With reference to FIG. 3, target structure 56 comprises an overlying passivation layer 44 that covers an etch target such as link 22 that is formed upon an optional underlying passivation layer 46 above substrate 42. The passivation layer 44 may include any conventionally used passivation materials. Typical passivation materials include silicon dioxide and silicon nitride. The underlying passivation layer 46 may include the same or different passivation material(s) as the overlying passivation layer 44. In particular, underlying passivation layer 46 in target structures 56 may comprise fragile materials, including but not limited to, materials formed from low K materials, low K dielectric materials, low K oxide-based dielectric materials, orthosilicate glasses (OSGs), flourosilicate glasses, organosilicate glasses, tetraethylorthosilicate (TEOS), methyltriethoxyorthosilicate (MTEOS), propylene glycol monomethyl ether acetate (PGMEA), silicate esters, hydrogen silsesquioxane (HSQ), methyl silsesquioxane (MSQ), polyarylene ethers, benzocyclobutene (BCB), "SiLK" sold by Dow, or "Black Diamond" sold by AMAT. Underlying passivation layers 46 made from some of these materials are more prone to crack when their targeted links 22 are blown or ablated by conventional single laser pulse link removal operations.

Figure 2C:
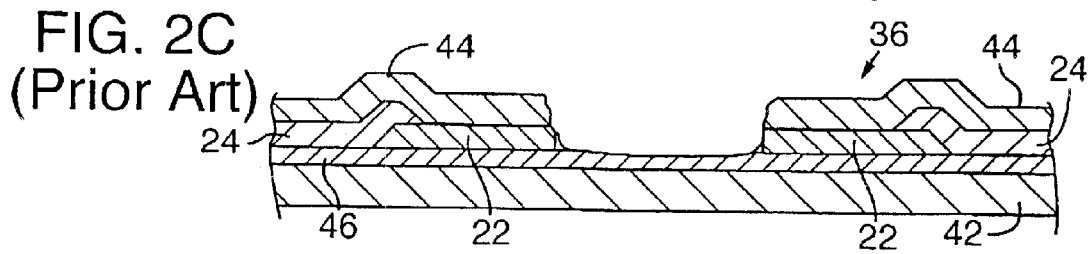
FIG. 2C is a fragmentary cross-sectional side view of the link structure of FIG. 2B after the link is removed by the prior art laser pulse.

FIG. 3A shows a target area 51 of overlying passivation layer 44 of a target structure 56 receiving a laser spot 55 of laser output 140 characterized by an energy distribution adapted to achieve removal of overlying passivation layer 44 in accordance with the present invention. The laser output 140 can have a much lower power than a conventional pulse of laser output 48 because the power necessary for removing overlying passivation layer 44 can be significantly lower than the power needed to blow link 22 (and passivation layer 44) as shown in FIGS. 2A and 2C. The lower powers facilitated by the passivation layer-removing and target-etch process substantially increase the processing window for the parameters of the laser output. Therefore, passivation layer removal provides more choices for laser sources that can be selected based on other criteria such as wavelength, spot size, and availability.

FIG. 3B shows target structure 56 after an impinged portion 58 of target area 51 of overlying passivation layer 44 (indicated by an arrow where removed) has been removed by laser output 140.

FIG. 3C shows target structure 56 of FIG. 3B after an exposed portion 61 of link 22 has been removed by etching. Skilled persons will recognize that etching, particularly chemical and plasma etching, is well known from photolithography and other circuit fabrication processes.

The passivation removal technique described with respect to FIG. 3 is far less likely to generate debris of link material common to link-blowing processes. Even if the passivation ablation process dips into a link 22 and generates some link material debris, such debris would be cleaned off during the following chemical etch process. Thus, for some applications removal a small portion of the top of link 22 may be desirable to insure that enough of passivation layer 44 is removed so as not to impede the subsequent link etch process, nevertheless it is desirable to minimize laser impingement on link 22 to minimize redeposit of link material and avoid cracking the surrounding passivation. The substrate protection, smaller critical dimensions, and reduced risk of causing cracks in the underlying passivation afforded by the passivation removal and link-etching process are, therefore, significant improvements over the conventional link-blowing process.

The embodiments described with respect to FIG. 3 permit IC manufacturers to laser process on-the-fly unique positions on circuit elements 14 having minimum pitch dimensions limited primarily by the emission wavelength of the laser output 140. Links 22 can, for example, be within less than a couple of microns of other links or adjacent circuit structures 34. Skilled persons will also appreciate that because etching can remove thicker links more effectively than traditional link blowing can, memory manufacturers can decrease link width 25 by designing thicker links to maintain or increase signal propagation speed or current carrying capacity.

FIGS. 4–6, and 11C show power versus time graphs of exemplary sets or bursts 50a, 50b, 50c, and 50d (generically sets or bursts 50) of laser pulses 52a, $52b_1$–$52b_8$, $52c_1$–$52c_5$, and $52d_1$–$52d_2$ (generically laser pulses 52) employed to remove the overlying passivation layer 44 above links 22 in accordance with the present invention. Preferably, each set 50 removes passivation over a single link 22. Preferred sets 50 include 1 to 20 pulses 52, more preferably 1 to 5 pulses 52, and most preferably 1 to 2 pulses 52. The duration of each set 50 is preferably shorter than about 1000 ns, more preferably shorter than 500 ns, and most preferably in the range of about 5 ns to 300 ns. Sets 50 are time-displaced by a programmable delay interval that is typically shorter than 0.1 millisecond and may be a function of the speed of the positioning system 62 and the distance between the links 22 to be processed. The pulse width of each laser pulse 52 within set 50 is in the range of about 30 ns to about 50 fs or shorter.

During a set 50 of laser pulses 52, each laser pulse 52 has insufficient heat, energy, or peak power to sever a link 22 or damage the underlying substrate 42 but removes a part of the overlying passivation layer 44. At a preferred wavelength from about 150 nm to about 2000 nm, preferred ablation parameters of focused spot size 59 of laser pulses 52 include laser energies of each laser pulse between about 0.005 μJ to about 10 μJ (and intermediate energy ranges between 0.01 μJ to about 1 μJ) and laser energies of each set between 0.01 μJ to about 10 μJ at greater than about 1 Hz, and preferably 10 kHz to 50 kHz or higher. The focused laser spot diameter is preferably 50% to 100% larger than the width of the link 22, depending on the link width 28, link pitch size 32, link material and other link structure and process considerations.

Depending on the wavelength of laser output and the characteristics of the passivation layer 44, the removal depth of pulses 52 applied to passivation layer 44 can be accurately controlled by choosing the energy of each pulse 52 and the number of laser pulses 52 in each set 50 to completely expose any given link 22 by cleaning off the bottom of passivation layer 44, leaving at least the bottom portion of the link 22, if not the whole link 22, relatively intact and thereby not exposing the underlying passivation layer 44 or the substrate 42 to any high laser energy. It is preferred, but not essential, that a major portion of the thickness of a given link 22 remains intact in any passivation removal process. Hence, the risk of cracking even a fragile passivation layer 46 or damaging the silicon substrate 42 is substantially eliminated, even if a laser wavelength in the UV range is used.

Figure 4:
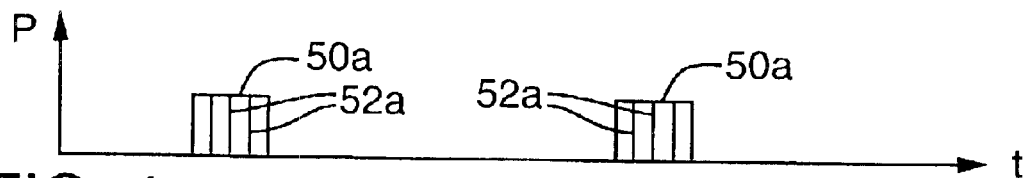
FIG. 4 shows a power versus time graph of exemplary sets of constant amplitude laser pulses employed to remove passivation material over links in accordance with the present invention.
Figure 8:
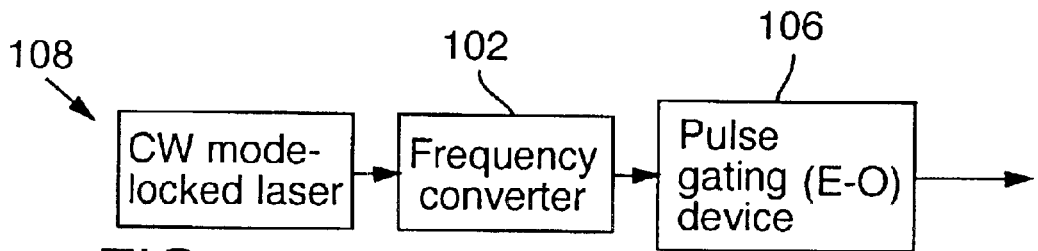
FIG. 8 is a simplified schematic diagram of one laser configuration that can be employed to implement the present invention.

The energy density profile of each set 50 of laser pulses 52 can be controlled better than the energy density profile of a conventional single multiple nanosecond laser pulse. With reference to FIG. 4, each laser pulse 52a can be generated with the same energy density to provide a pulse set 50a with a consistent "flat-top" energy density profile. Set 50a can, for example, be accomplished with a mode-locked laser followed by an electro-optic (E-O) or acousto-optic (A-O) optical gate and an optional amplifier (FIG. 8).

Figure 5:
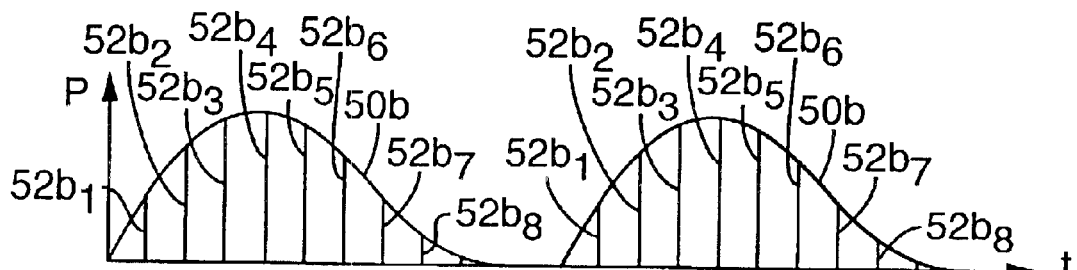
FIG. 5 shows a power versus time graph of alternative exemplary sets of modulated amplitude laser pulses employed to remove passivation material over links in accordance with the present invention.

With reference to FIG. 5, the energy densities of pulses $52b_1$–$52b_8$ (generically 52b) can be modulated so that sets 50b of pulses 52b can have almost any predetermined shape, such as the energy density profile of a conventional multiple nanosecond laser pulse with a gradual increase and decrease of energy densities over pulses $52b_1$–$52b_8$. Sets 50b can, for example, be accomplished with a simultaneously Q-switched and CW mode-locked laser system 60 shown in FIG. 7. Sequential sets 50 may have different peak power and energy density profiles, particularly if passivation layers 44 with different characteristics are being processed.

Figure 6:
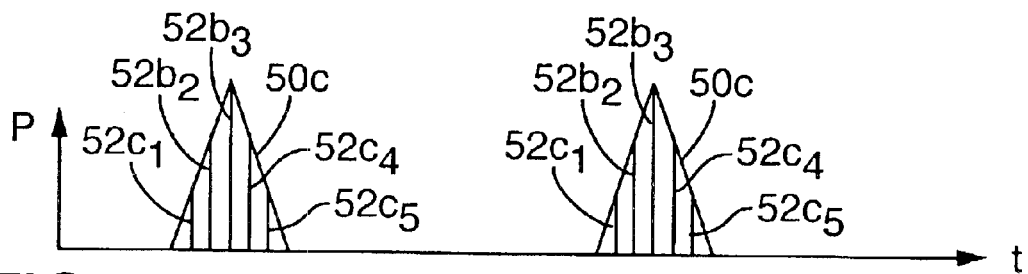
FIG. 6 shows a power versus time graph of other alternative exemplary sets of modulated amplitude laser pulses employed to remove passivation material over links in accordance with the present invention.

FIG. 6 shows an alternative energy density profile of pulses $52c_1$–$52c_5$ (generically 52c) that have sharply and symmetrically increasing and decreasing over sets 50c. Sets 50c can be accomplished with a simultaneously Q-switched and CW mode-locked laser system 60 shown in FIG. 7. Another alternative set 50 that is not shown has initial pulses 52 with high energy density and trailing pulses 52 with decreasing energy density.

Figure 7:
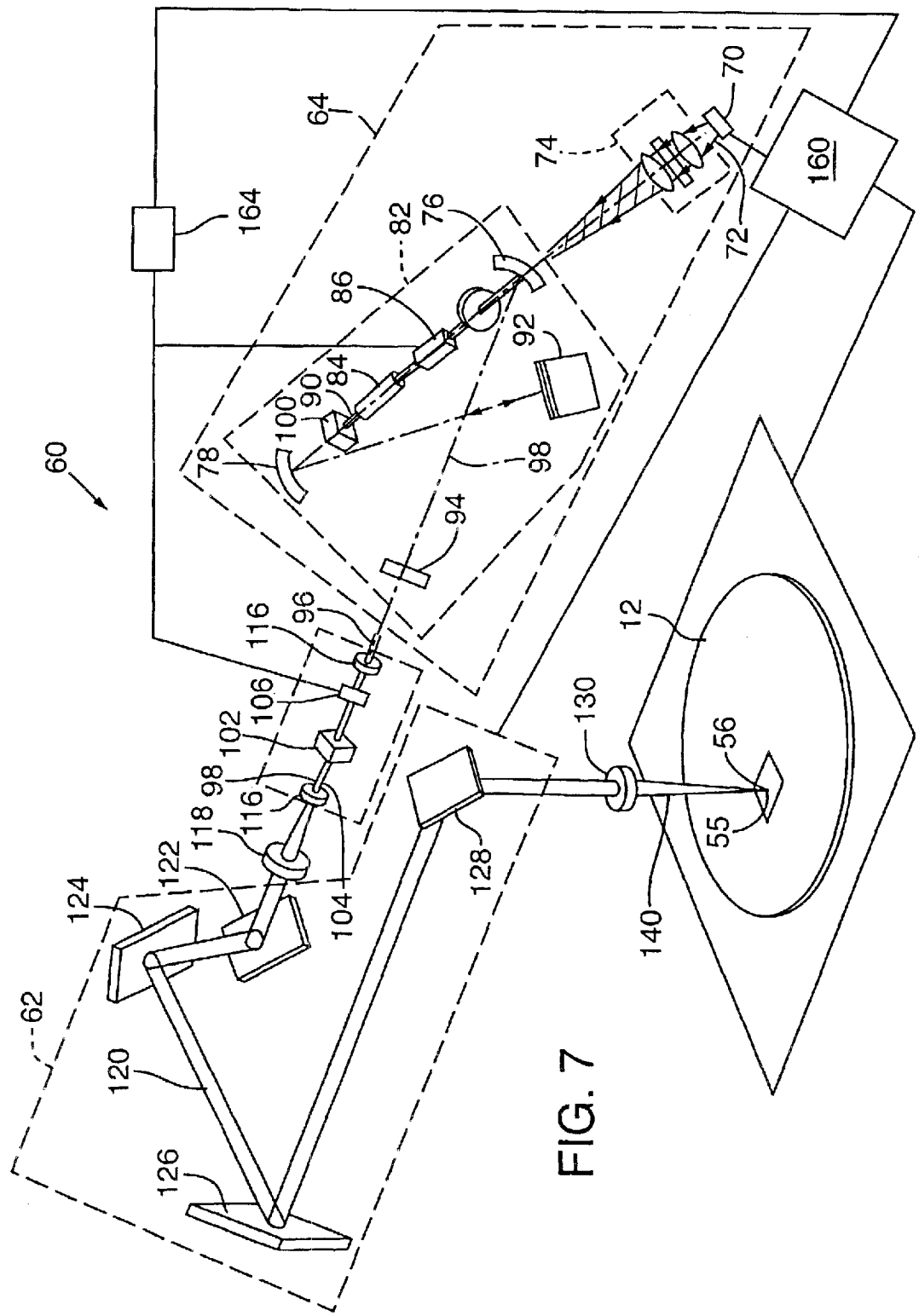
FIG. 7 is a partly schematic, simplified diagram of an embodiment of an exemplary green laser system including a work piece positioner that cooperates with a laser processing control system for practicing the method of the present invention.

FIG. 7 shows a preferred embodiment of a simplified laser system 60 including a Q-switched and/or CW mode-locked laser 64 for generating sets 50 of laser pulses 52 desirable for achieving passivation layer removal in accordance with the present invention. Preferred laser wavelengths from about 150 nm to about 2000 nm include, but are not limited to, 1.3, 1.064, or 1.047, 1.03–1.05, 0.75–0.85 μm or their second, third, fourth, or fifth harmonics from Nd:YAG, Nd:YLF, Nd:YVO$_4$, Yb:YAG, or Ti:Sapphire lasers 64. Skilled persons will appreciate that lasers emitting at other suitable wavelengths are commercially available, including fiber lasers, and could be employed.

Laser system 60 is modeled herein only by way of example to a second harmonic (532 nm) Nd:YAG laser 64 since the frequency doubling elements can be removed to eliminate the harmonic conversion. The Nd:YAG or other solid-state laser 64 is preferably pumped by a laser diode 70 or a laser diode-pumped solid-state laser, the emission 72 of which is focused by lens components 74 into laser resonator 82. Laser resonator 82 preferably includes a lasant 84, preferably with a short absorption length, and a Q-switch 86 positioned between focusing/folding mirrors 76 and 78 along an optic axis 90. An aperture 100 may also be positioned between lasant 84 and mirror 78. Mirror 76 reflects light to mirror 78 and to a partly reflective output coupler 94 that propagates laser output 96 along optic axis 98. Mirror 78 is adapted to reflect a portion of the light to a semiconductor saturable absorber mirror device 92 for mode locking the laser 64. Skilled person will appreciate that a Q-switched laser 64 without CW mode-locking is preferred for several embodiments, particularly for applications employing pulse widths. greater than 1 ns. Such laser systems 60 do not employ a saturable absorber and optical paths 90 and 98 are collinear. Such alternative laser systems 60 are commercially available and well known to skilled practitioners.

A harmonic conversion doubler 102 is preferably placed externally to resonator 82 to convert the laser beam frequency to the second harmonic laser output 104. Skilled persons will appreciate that where harmonic conversion is employed, a gating device 106, such as an E-O or A-O device can be positioned before the harmonic conversion apparatus to gate or finely control the harmonic laser pulse energy. Skilled persons will appreciate that any of the second, third, or fourth harmonics of Nd:YAG (532 nm, 355 nm, 266 nm); Nd:YLF (524 nm, 349 nm, 262 nm) or the second harmonic of Ti:Sapphire (375–425 nm) can be employed to preferably process certain types of passivation layers 44 over links 22 using appropriate well-known harmonic conversion techniques. Harmonic conversion processes are described in pp. 138–141, V. G. Dmitriev, et. al., "Handbook of Nonlinear Optical Crystals", Springer-Verlag, New York, 1991 ISBN 3-540-53547-0.

An exemplary laser 64 can be a mode-locked Ti-Sapphire ultrashort pulse laser with a laser wavelength in the near IR range, such as 750–850 nm. Spectra Physics makes a Ti-Sapphire ultra fast laser called the MAI TAI™ which provides ultrashort pulses 52 having a pulse width of 150 femtoseconds (fs) at 1 W of power in the 750 to 850 nm range at a repetition rate of 80 MHz. This laser 64 is pumped by a diode-pumped, frequency-doubled, solid-state green YAG laser (5 W or 10 W). Other exemplary ultrafast Nd:YAG or Nd:YLF lasers 64 include the JAGUAR-QCW-1000™ and the JAGUAR-CW-250™ sold by Time-Bandwidth® of Zurich, Switzerland.

Figure 9:
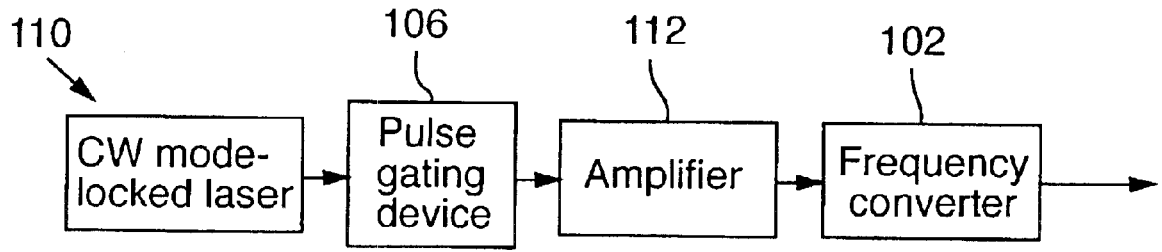
FIG. 9 is a simplified schematic diagram of an alternative embodiment of a laser configuration that can be employed to implement the present invention.

FIG. 8 shows a schematic diagram of a simplified alternative configuration of a laser system 108 for employing the present invention. FIG. 9 shows a schematic diagram of another simplified alternative configuration of a laser system 110 for that employs an amplifier 112.

Laser output 104 (regardless of wavelength or laser type) can be manipulated by a variety of conventional optical components 116 and 118 that are positioned along a beam path 120. Components 116 and 118 may include a beam expander or other laser optical components to collimate laser output 104 to produce a beam with useful propagation characteristics. One or more beam reflecting mirrors 122, 124, 126 and 128 are optionally employed and are highly reflective at the laser wavelength desired, but highly transmissive at the unused wavelengths, so only the desired laser wavelength will reach link structure 56. A focusing lens 130 preferably employs an F1, F2, or F3 single component or multicomponent lens system that focuses the collimated pulsed laser system output 140 to produce a focused spot size 59 that is greater than the link width 28, encompasses it, and is preferably less than 2 μm in diameter or smaller depending on the link width 28 and the laser wavelength.

A preferred beam positioning system 62 is described in detail in U.S. Pat. No. 4,532,402 of Overbeck. Beam positioning system 62 preferably employs a laser controller 160 that controls at least two platforms or stages (stacked or split-axis) and coordinates with reflectors 122, 124, 126, and 128 to target and focus laser system output 140 to a desired laser link 22 on IC device or work piece 12. Beam positioning system 62 permits quick movement between links 22 on work piece 12 to effect unique passivation removal operations on-the-fly based on provided test or design data.

The position data preferably direct the focused laser spot 55 over work piece 12 to target link structure 56 with one set 50 of pulses 52 of laser system output 140 to remove target area 51 of passivation layer 44. The laser system 60 preferably removes each target area 51 on-the-fly with a single set 50 of laser pulses 52 without stopping the beam positioning system 62 over any link 22, so high throughput is maintained.

Because the sets 50 are less than about 1,000 ns, each set 50 is treated like a single pulse by positioning system 62, depending on the scanning speed of the positioning system 62. For example, if a positioning system 62 has a high speed of about 200 mm per second, then a typical displacement between two consecutive laser spots 55 with interval time of 1,000 ns between them would be typically less than 0.2 μm and preferably less then 0.06 μm during a preferred time interval of 300 ns of set 50, so two or more consecutive spots 55 would substantially overlap and each of the spots 55 would completely cover the link width 28. In addition to control of the repetition rate, the time offset between the initiation of pulses 52 within a set 50 is typically less than 1,000 ns and preferably between about 5 ns and 500 ns and can also be programmable by controlling laser synchronization as later described.

Laser controller 160 is provided with instructions concerning the desired energy and pulse width of laser pulses 52, the number of pulses 52, and/or the shape and duration of sets 50 according to the characteristics of link structures 56. Laser controller 160 may be influenced by timing data that synchronizes the firing of laser system 60 to the motion of the platforms such as described in U.S. Pat. No. 5,453,594 of Konecny for Radiation Beam Position and Emission Coordination System. Alternatively, skilled persons will appreciate that laser controller 160 may be used for extracavity modulation of laser energy via an E-O or an A-O device 106 and/or may optionally instruct one or more subcontrollers 164 that control Q-switch 86 or gating device 106. Beam positioning system 62 may alternatively or additionally employ the improvements or beam positioners described in U.S. Pat. No. 5,751,585 of Cutler et al. or U.S. Pat. No. 6,430,465 B2 of Cutler, which are assigned to the assignee of this application. Other fixed head, fast positioner head such as galvanometer, piezoelectrically, or voice coil-controlled mirrors, or linear motor driven conventional positioning systems or those employed in the 9300 or 9000 model series manufactured by Electro Scientific Industries, Inc. (ESI) of Portland, Oreg. could also be employed.

With reference again to FIGS. 4–6, in some embodiments, each set 50 of laser pulses 52 is preferably a burst of ultrashort laser pulses 52, which are generally shorter than 25 ps, preferably shorter than or equal to 10 Ps, and most preferably from about 10 ps to 100 fs or shorter. The laser pulse widths are preferably shorter than 10 ps because material processing with such laser pulses 52 is believed to be a nonthermal process unlike material processing with laser pulses of longer pulse widths. Skilled persons will also appreciate that due to the ultrashort laser pulse width and the higher laser intensity, a higher laser frequency conversion efficiency can be readily achieved and employed. When laser output 140 comprises ultrashort pulses 52, the duration of each set 50 can be less than 1,000 ns as previously described, but the set duration is preferably less than 300 ns and more preferably in the range of 10 ns to 200 ns.

During a set 50 of ultrashort laser pulses 52, each laser pulse 52 pits off a small part or sublayer of the passivation layer 44 needed to be removed without generating significant heat in link structure 56 or an IC device of work piece 12. Due to its extremely short pulse width, each pulse 52 exhibits high laser energy intensity that causes dielectric breakdown in conventionally transparent passivation materials. Each ultrashort laser pulse 52 breaks off a thin sublayer of, for example, about 500–2,000 Å of overlying passivation layer 44 until overlying passivation layer 44 is removed. For conventionally opaque material, each ultrashort pulse 52 ablates a sublayer having a thickness comparable to the absorption depth of the material at the wavelength used. The absorption or ablation depth per single ultrashort laser pulse for most metals is about 100–300 Å, so that the passivation layer 44 can completely be removed with comparatively little penetration into the metal of link 22. In an exemplary embodiment, each ultrashort laser pulse 52 removes about a 0.02–0.2 µm depth of material within spot size 59.

Skilled persons will appreciate that when longer pulses are employed at laser wavelengths not absorbed by the passivation layer 44, sufficient energy must be supplied to the top of the link 22 so that it causes a rupture in the passivation layer 44. In such embodiments, a large portion of the top of links 22 may be removed. However, subsequently etching the remaining portions of exposed links 22 still provides better quality and tighter tolerances than removing the entire link 22 with a conventional link-blowing laser pulse.

In some preferred embodiments, the laser output 140 for removing the passivation layer 44 over each link 22 to be severed comprises a single laser output pulse 52. Such single laser output pulse 52 preferably has a pulse width that is shorter than about 20 ns, preferably shorter than about 1 ns, and most preferably shorter than about 10 to 25 ps. An exemplary laser pulse 52 of a single pulsed set 50 has laser pulse energies ranging between about 0.005 µJ to about 2 µJ, or even up to 10 µJ, and intermediate energy ranges between 0.01 µJ to about 0.1 µJ. Although these ranges of laser pulse energies largely overlap those for laser pulses 52 in multiple sets, skilled persons will appreciate that a laser pulse 52 in a single pulse set 50 will typically contain a greater energy than a laser pulse 52 in a multiple set employed to process similar passivation materials of similar thicknesses. Skilled persons will appreciate that laser sets 50 of one or more sub-nanosecond laser pulses 52 may be generated by the laser systems 60 already described but may also be generated by a laser having a very short resonator.

In some embodiments, each set 50 preferably includes two pulses 52, which are preferably in the range of about 0.1 ps to about 30 ns and more preferably from about 25 ps to 30 ns or ranges in between such as from about 100 ps to 10 ns or from 5 ns to 20 ns. These sets 50 of laser pulses 52 may be generated by the laser systems 60 already described. However, additional methods and laser system configurations can be used to generate such sets 50 and of two pulses 52, such as methods employing an optical delay path or a step-controlled or misaligned Q-switch as disclosed in U.S. patent application Ser. No. 10/322,347 of Sun et al. which is herein incorporated by reference. Laser system 60c shown in FIG. 10 can also be employed to generate such sets 50 of two pulses 52.

Figure 10:
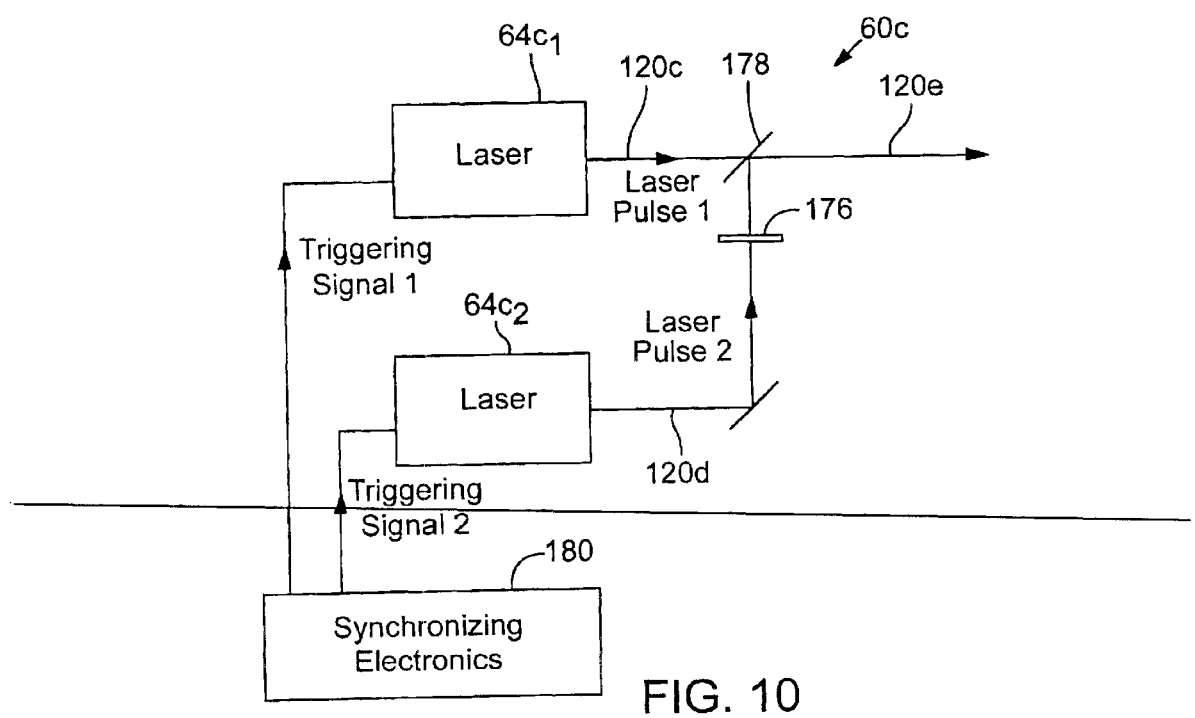
FIG. 10 is a simplified schematic diagram of an alternative embodiment of a laser system that employs two or more lasers to implement the present invention.
Figures 11A, 11B, 11C:
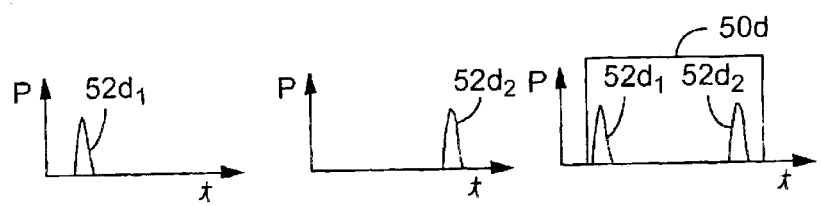
FIGS. 11A–11C show respective power versus time graphs of exemplary laser pulses propagating along separate optical paths of the laser system shown in FIG. 10.

FIG. 10 is a simplified schematic diagram of an alternative embodiment of a laser system 60c that employs two or more lasers 64c₁ and 64c₂ (generally lasers 64) to implement the present invention, and FIGS. 11A–11C. show respective power versus time graphs of an exemplary laser pulses 52d₁ and 52d₂ (generically 52d) propagating along optical paths 120c, 120d, and 120e of laser system 60c shown in FIG. 10. With reference to FIGS. 10 and 11A–11C, lasers 64 are preferably Q-switched (preferably not CW mode locked) lasers of types previously discussed or well-known variations and can be of the same type or different types. Skilled persons will appreciate that lasers 64 are preferably the same type and their parameters are preferably controlled to produce preferred, respectively similar spot sizes, pulse energies, and peak powers. Lasers 64 can be triggered by synchronizing electronics 180 such that the laser outputs are separated by a desired or programmable time interval. A preferred time interval includes about 5 ns to about 1,000 ns.

Laser 64c₁ emits laser pulse 52d₁ that propagates along optical path 120c and then passes through a combiner 178, and laser 64c₂ emits laser pulse 52d₂ that propagates along optical path 120d and then passes through an optional half wave plate 176 and the combiner 178, such that both laser pulses 52d₁ and 52d₂ propagate along optical path 120e but are temporally separated to produce a set 50d of laser pulses 52d having a power versus time profile shown in FIG. 11C.

With respect to all the embodiments, preferably each set 50 removes passivation layer 44 over a single link 22. In most applications, the energy density profile of each set 50 is identical. However, when a work piece 12 includes different types (different materials or different dimensions) of link structures 56, then a variety of energy density profiles (heights and lengths and as well as the shapes) can be applied as the positioning system 62 scans over the work piece 12.

In view of the foregoing, passivation processing with sets 50 of laser pulses 52 and subsequent etching of links 22 offers a wider processing window and a superior quality of severed links than does conventional link processing, and the processing of narrower and denser links 22 is also facilitated. The versatility of laser pulses 52 in sets 50 permits better tailoring to particular passivation characteristics. In addition to the "nonthermal" and wellcontrollable nature of ultrashort laser processing, the most common ultrashort laser source is at a wavelength of about 800 nm and facilitates delivery of a small-sized laser spot, particularly if the wavelength is harmonically doubled.

Similarly, passivation layers 44 above or below the links 22 can be made with material other than the traditional $SiO_2$ and SiN, such as the low K material, or can be modified if desirable to be other than a typical height since the sets 50 of pulses 52 can be tailored and since there is less damage risk to the passivation structure. In addition, because wavelengths much shorter than about 1.06 µm can be employed to produce critical spot size diameters 59 of less than about 2 µm and preferably less than about 1.5 µm or less than about 1 µm, center-to-center pitch 32 between links 22 processed with sets 50 of laser pulses 52 can be substantially smaller than the pitch 32 between links 22 blown by a conventional IR laser beam-severing pulse. Links 22 can, for example, be within a distance of 2.0 μm or less from other links 22 or adjacent circuit structures 34.

Skilled persons will also appreciate that for some embodiments, the links 22 and the bond pads are be made from the same material, such aluminum, and such bond pads can be (self–) passivated to withstand etching of exposed links 22. In other embodiments, the links 22 and the bond pads are made from different materials, such as links 22 made of copper and bond pads made of aluminum. In such cases, the nonexistence of passivation over the bond pads may be irrelevant because etch chemistries may be employed that do not adversely affect the bond pads. In some circumstances, it may be desirable to protect the bond pads by coating the surface of the work piece with a protection layer that is easy to remove with the overlying passivation layer 44 during the aforementioned laser processes and, if desirable, easy to remove from the remaining work piece surfaces once link etching is completed. Material for such a protection layer may include, but is not limited to, any protective coating such as any resist material with or without photosensitizers, particularly materials having a low laser ablation threshold for the selected wavelength of laser pulses 52.

It will be obvious to those having skill in the art that many changes may be made to the details of the above-described embodiment of this invention without departing from the underlying principles thereof.

What is claimed is:

1. A method of selectively removing a passivation material overlying electrically conductive redundant memory or integrated circuit links having associated link structures, each link having a link width and being positioned between an associated pair of electrically conductive contacts in a circuit fabricated on either a substrate or an optional underlying passivation layer between the electrically conductive link and the substrate, the substrate and any optional underlying passivation layer as associated with the link structures being characterized by respective laser damage thresholds, comprising:

providing to a beam positioner beam positioning data representing one or more locations of electrically conductive links, the beam positioner in response to the beam positioning data imparting relative movement of a laser spot position to the substrate;

generating for each selected link structure a set of two or more time-displaced laser output pulses, each of the laser output pulses in the set characterized by a laser spot at its associated laser spot position, each laser spot having a spot size and energy characteristics including approximately the same energy and approximately the same peak power, the spot size being larger than the link width and the energy characteristics being below the respective laser damage thresholds of any underlying passivation layer and the substrate and insufficient to sever the link; and coordinating laser output pulse generation and the relative movement imparted by the beam positioner such that the relative movement is substantially continuous while the laser output pulses in the set sequentially strike the overlying passivation layer above the selected link structure so that the laser spot of each laser output pulse in the set encompasses the link width and the set removes the overlying passivation layer above the electrically conductive link without causing damage to any underlying passivation layer and the substrate.

2. The method of claim 1 in which each set of laser output pulses has a duration of shorter than 1,000 nanoseconds.

3. The method of claim 1 in which each set of laser output pulses has a duration of shorter than 300 nanoseconds.

4. The method of claim 1 in which each of the laser output pulses has a pulse width of between about 100 femtoseconds and 30 nanoseconds.

5. The method of claim 2 in which each of the laser output pulses has a pulse width of between about 100 femtoseconds and 30 nanoseconds.

6. The method of claim 1 in which each of the laser output pulses has a pulse width of shorter than 10 picoseconds.

7. The method of claim 2 in which each of the laser output pulses has a pulse width of shorter than 10 picoseconds.

8. The method of claim 1 in which each of the laser output pulses has a pulse width of shorter than about 1 nanosecond.

9. The method of claim 1 in which a time offset between initiation of at least two laser output pulses in the set is within about 5 to 1,000 ns.

10. The method of claim 1, in which at least two sets are generated to remove the passivation layer above respective links at a repetition rate greater than 10 kHz.

11. The method of claim 1 the pulse width of each laser pulses is shorter than 10 ps and at least one of the laser output pulses removes a 0.01–0.2 micron depth of the passivation layer by direct laser ablation.

12. The method of claim 1 in which the overlying passivation layer is removed by a substantially nonthermal interaction between at least one of the laser output pulses and the overlying passivation layer.

13. The method of claim 1 in which at least one of the laser output pulses removes at least 0.01–0.03 micron depth of the overlying passivation layer.

14. The method of claim 1 in which at least one of the electrically conductive links comprises aluminum, chromide, copper, polysilicon, disilicide, gold, nickel, nickel chromide, platinum, polycide, tantalum nitride, titanium, titanium nitride, tungsten, or tungsten silicide.

15. The method of claim 1 in which the underlying passivation layer comprises silicon dioxide, silicon nitride, silicon oxynitride, a low K material, a low K dielectric material, a low K oxide-based dielectric material, an orthosilicate glass (OSG), a fluorosilicate glass, an organosilicate glass, tetraethylorthosilicate (TEOS), methyltriethoxyorthosilicate (MTEOS), propylene glycol monomethyl ether acetate (PGMEA), a silicate ester, hydrogen silsesquioxane (HSQ), methyl silsesquioxane (MSQ), a polyarylene ether, or benzocyclobutene (BCB).

16. The method of claim 1, further comprising generating the laser output pulses at a wavelength between about 150 nm and 2000 nm.

17. The method of claim 1 in which each of the laser output pulses has a laser energy of about 0.005 microjoules to 10 microjoules.

18. The method of claim 1 in which the spot sizes of each the laser spots are the same.

19. The method of claim 1 in which the spot sizes of at least two of the laser spots are different.

20. The method of claim 1, further comprising generating the laser output pulses from a CW-pumped, mode-locked, solid-state laser, with optional optical gate device to gate the laser pulse set from the mode-locked laser pulse train, and with an optional amplifier to amplify the laser pulses to the energy level of about 0.005 to 10 microjoules per pulse.

21. The method of claim 1 in which at least two laser pulses in each set are generated by different lasers with a first laser generating at least a first laser output pulse for each set and a second laser generating at least a second laser output pulse for each set.

22. The method of claim 21 in which the spot sizes of the laser spots from the laser output pulses of the first and second lasers are the same.

23. The method of claim 21 in which the spot sizes of the laser spots from the laser output pulses of the first and second lasers are different.

24. The method of claim 21 in which the lasers are different types of lasers.

25. The method of claim 21 in which the lasers are the same type of laser.

26. The method of claim 1, further comprising:
performing an etch process to remove the selected electrically conductive links spatially aligned depthwise with removed regions of the overlying passivation layer.

27. A method of removing a passivation material overlying electrically conductive redundant memory or integrated circuit links positioned between respective pairs of electrically conductive contacts in a circuit fabricated on a substrate, each link having a link width, comprising:
providing to a beam positioner beam positioning data representing one or more locations of electrically conductive links in the circuit, the beam positioner coordinating relative movement between a laser spot position and the substrate;
generating, from a first laser, at least one first laser output pulse having a pulse width of between about 25 picoseconds and 30 nanoseconds during a first time interval that is shorter than about 1,000 nanoseconds, the first laser output pulse also having a first laser spot with a spot size that is greater than the link width;
directing, in accordance with the beam positioning data, the first laser output pulse so that the first laser spot impinges a first location of an overlying passivation layer above a first electrically conductive link between first contacts;
generating, from a second laser, at least one second laser output pulse having a pulse width of between about 25 picoseconds and 30 nanoseconds during the first time interval, the second laser output pulse also having a second laser spot with a spot size that is greater than the link width;
directing, in accordance with the beam positioning data, the second laser output pulse so that the second laser spot impinges the first location of the overlying passivation layer above the first electrically conductive link such that the first and second laser spots substantially overlap and the first and second laser output pulses contribute to the removal of the overlying passivation layer above the first electrically conductive link;
generating, from the first laser, at least one third laser output pulse having a pulse width of between about 25 picoseconds and 30 nanoseconds during a second time interval that is shorter than 1,000 nanoseconds and time-displaced from the first time interval, the third laser output pulse also having a third laser spot with a spot size that is greater than the link width;
directing, in accordance with the beam positioning data, the third laser output pulse so that the third laser spot impinges a second location of an overlying passivation layer above a second electrically conductive link between second contacts that is distinct from the first location;
generating, from the second laser, at least one fourth laser output pulse having a pulse width of between about 25 picoseconds and 30 nanoseconds during the second time interval, the fourth laser output pulse also having a fourth laser spot with a spot size that is greater than the link width;
directing, in accordance with the beam positioning data, the fourth laser output pulse to impinge the second location of the overlying passivation layer above the second electrically conductive link such that the third and fourth laser spots substantially overlap and the third and fourth laser output pulses contribute to the removal of the overlying passivation layer above the second electrically conductive link, performing an etch process to remove the selected electrically conductive links spatially aligned depthwise with removed regions of the overlying passivation layer, and
performing an etch process to remove the selected electrically conductive links spatially aligned depthwise with removed regions of the overlying passivation layer.

28. The method of claim 27 in which each of the laser output pulses has a pulse width of shorter than about 1 nanosecond.

29. The method of claim 27 in which a time offset between initiation of at least two laser output pulses in the set is within about 5 to 1,000 ns.

30. The method of claim 27 in which at least one of the laser output pulses removes at least 0.01–0.03 micron depth of the overlying passivation layer.

31. The method of claim 27 in which at least one of the electrically conductive links comprises aluminum, chromide, copper, polysilicon, disilicide, gold, nickel, nickel chromide, platinum, polycide, tantalum nitride, titanium, titanium nitride, tungsten, or tungsten suicide.

32. The method of claim 27 in which the underlying passivation layer comprises silicon dioxide, silicon nitride, silicon oxynitride, a low K material, a low K dielectric material, a low K oxide-based dielectric material, an orthosilicate glass (OSG), a fluorosilicate glass, an organosilicate glass, tetraethylorthosilicate (TEOS), methyltriethoxyorthosilicate (MTEOS), propylene glycol monomethyl ether acetate (PGMEA), a silicate ester, hydrogen silsesquioxane (HSQ), methyl silsesquioxane (MSQ), a polyarylene ether, or benzocyclobutene (BCB).

33. The method of claim 27, further comprising generating the laser output pulses at a wavelength between about 150 nm and 2000 nm.

34. The method of claim 27 in which each of the laser output pulses has a laser energy of about 0.005 microjoule to 10 microjoules.

35. The method of claim 27 in which the spot sizes of each the laser spots are the same.

36. The method of claim 27 in which the spot sizes of at least two of the laser spots are different.

37. The method of claim 27 in which each of the laser output pulses has approximately the same energy and approximately the same peak power.

38. The method of claim 27 in which at least two of the laser output pulses have different energies and different peak powers.

39. The method of claim 27 in which the first and second lasers are different types of lasers.

40. The method of claim 27 in which the first and second lasers are the same type of laser.

41. A method employing laser output pulses on-the-fly to process positions on an overlying passivation layer covering respective electrically conductive links lying spatially below the overlying passivation layer and in proximity to a neighboring passivation material that is susceptible to damage from the laser output pulses, the electricafly conductive links being positioned between respective pairs of electrically conductive contacts, and the overlying passivation layer comprising silicon dioxide, silicon nitride, or silicon oxynitride, comprising:

generating, from a laser, a first set of at least one laser output pulse during a first time interval, each of the laser output pulses in the first set having a pulse width duration of between about 0.05 picoseconds and 30 nanoseconds and the first set having a set width duration of shorter than 300 nanoseconds;

directing, in response to beam positioning data, the first set to impinge a first region of the overlying passivation layer that is spatially aligned with a first electrically conductive link at a first location between first contacts, and at least one of the laser output pulses from the first set characterized by an energy distribution of that is sufficient to remove the first region of the overlying passivation layer and expose the first electrically conductive link but insufficient to sever the first link or damage the neighboring passivation material;

generating, from the laser, a second set of at least one laser output pulse during a second time interval, each of the laser output pulses in the second set having a pulse width duration of between about 0.05 picoseconds and 30 nanoseconds and the second set having a set width duration of shorter than 300 nanoseconds; and directing, in response to beam positioning data, the second set to impinge a second region of the overlying pass ivation layer that is different from the first region and is spatially aligned with a second electrically conductive link at a second location between second contacts, and at least one of the laser output pulses from the second set being characterized by an energy distribution that is sufficient to remove the second region of the overlying passivation layer and expose the second electrically conductive link but insufficient to sever the second electrically conductive link or damage the neighboring passivation material.

42. The method of claim 41 in which the first and second sets each consist of a single laser output pulse.

43. The method of claim 41, further comprising generating the first and second sets of laser output pulses at a wavelength between about 200 urn and 2000 nm.

44. The method of claim 41, further comprising:
performing an etch process to remove the selected electrically conductive links spatially aligned depthwise with removed regions of the overlying passivation layer.

45. The method of claim 41 in which the laser output pulses has a spot size that is smaller than 3 microns but larger than the widths of the first or second links.

46. The method of claim 41 in which the overlying passivation layer is covered by a protective coating.

47. The method of claim 41 in which the electrically conductive links comprise poly-silicon, aluminum, copper, gold, nickel, platinum, titanium, tungsten, a metal, tungsten nitride, TiN, tantalum nitride, a metal nitride, tungsten silicide, a metal suicide, or a metal alloy.

48. The method of claim 41 in which the neighboring passivation layer comprises silicon dioxide, silicon nitride, silicon oxynitride, a low K material, a low K dielectric material, a low K oxide-based dielectric material, an ortho- silicate glass (OSG), a fluorosilicate glass, an organosilicate glass, tetraethylorthosilicate (TEOS), methyltriethoxyorthosilicate (MTEOS), propylene glycol monomethyl ether acetate (PGMEA), a silicate ester, hydrogen silsesquioxane (HSQ), methyl silsesquioxane (MSQ), a polyarylene ether, or benzocyclobutene (BCB).

49. The method of claim 41 in which each selected electrically conductive link has a depthwise thickness and in which a major portion of the depthwise thickness remains intact during removal of the overlying passivation layer.

50. The method of claim 41, further comprising generating the laser output pulses from a CW-pumped, mode-locked, solid-state laser, with optional optical gate device to gate the laser pulse set from the mode-locked laser pulse train, and with an optional amplifier to ampli& the laser pulses to the energy level of 0.005 to 10 microjoules per pulse.

51. The method of claim 41, further comprising generating the laser output pulses from a diode-pumped, Q-switched, solid-state laser.

52. A method of selectively removing a passivation material overlying electrically conductive redundant memory or integrated circuit links having associated link structures, each link having a link width and being positioned between an associated pair of electrically conductive contacts in a circuit fabricated on either a substrate or an optional underlying passivation layer between the electrically conductive link and the substrate, the substrate and any optional underlying passivation layer as associated with the link structures being characterized by respective laser damage thresholds, comprising:

providing to a beam positioner beam positioning data representing one or more locations of electrically conductive links, the beam positioner in response to the beam positioning data imparting relative movement of a laser spot position to the substrate;

generating for each selected link structure a set of two or more time-displaced laser output pulses, each of the laser output pulses in the set characterized by a laser spot having a spot size and energy characteristics at the laser spot position, at least two of the laser output pulses of the set having different energies and different peak powers, and the spot size being larger than the link width and the energy characteristics being below the respective laser damage thresholds of any underlying passivation layer and the substrate and insufficient to sever the link; and coordinating laser output pulse generation and the relative movement imparted by the beam positioner such that the relative movement is substantially continuous while the laser output pulses in the set sequentially strike the overlying passivation layer above the selected link structure so that the laser spot of each laser output pulse in the set encompasses the link width and the set removes the overlying passivation layer above the electrically conductive link without causing damage to any underlying passivation layer and the substrate.

53. The method of claim 52 in which each set of laser output pulses has a duration of shorter than 1,000 nanoseconds.

54. The method of claim 52 in which each set of laser output pulses has a duration of shorter than 300 nanoseconds.

55. The method of claim 52 in which each of the laser output pulses has a pulse width of between about 100 femtoseconds and 30 nanoseconds.

56. The method of claim 53 in which each of the laser output pulses has a pulse width of between about 100 femtoseconds nanoseconds.

57. The method of claim 52 in which each of the laser output pulses has a pulse width of shorter than 10 picoseconds.

58. The method of claim 53 in which each of the laser output pulses has a pulse width of shorter than 10 picoseconds.

59. The method of claim 52 in which each of the laser output pulses has a pulse width of shorter than about 1 nanosecond.

60. The method of claim 52 in which a time offset between initiation of at least two laser output pulses in the set is within about 5 to 1,000 ns.

61. The method of claim 52, in which at least two sets are generated to remove the passivation layer above respective links at a repetition rate greater than 10 kHz.

62. The method of claim 52 in which the pulse width of each laser output pulse is shorter than 10 ps and at least one of the laser output pulses removes a 0.01–0.2 micron depth of the passivation layer by direct laser ablation.

63. The method of claim 52 in which the overlying passivation layer is removed by a substantially nonthermal interaction between at least one of the laser output pulses and the overlying passivation layer.

64. The method of claims 52 in which at least one of the laser output pulses removes at least 0.01–0.03 micron depth of the overlying passivation layer.

65. The method of claim 52 in which at least one of the electrically conductive links comprises aluminum, chromide, copper, polysilicon, disilicide, gold, nickel, nickel chromide, platinum, polycide, tantalum nitride, titanium, titanium nitride, tungsten, or tungsten silicide.

66. The method of claim 52 in which the underlying passivation layer comprises silicon dioxide, silicon nitride, silicon oxynitride, a low K material, a low K dielectric material, a low K oxide-based dielectric material, an orthosilicate glass (OSG), a fluorosilicate glass, an organosilicate glass, tetraethylorthosilicate (TEOS), methyltriethoxyorthosilicate (MTEOS), propylene glycol monomethyl ether acetate (PGMEA), a silicate ester, hydrogen silsesquioxane (HSQ), methyl silsesquioxane (MSQ), a polyarylene ether, or benzocyclobutene (BCB).

67. The method of claim 52, further comprising generating the laser output pulses at a wavelength between about 150 nm and 2000 nm.

68. The method of claim 52 in which each of the laser output pulses has a laser energy of about 0.005 microjoule to 10 microjoules.

69. The method of claim 52 in which the spot sizes of each the laser spots are the same.

70. The method of claim 52 in which the spot sizes of at least two of the laser spots are different.

71. The method of claim 52, further comprising generating the laser output pulses from a CW-pumped, mode-locked, solid-state laser, with optional optical gate device to gate the laser pulse set from the mode-locked laser pulse train, and with an optional amplifier to amplify the laser pulses to the energy level of about 0.005 microjoule to 10 microjoules per pulse.

72. The method of claim 52 in which at least two laser pulses in each set are generated by different lasers with a first laser generating at least a first laser output pulse for each set and a second laser generating at least a second laser output pulse for each set.

73. The method of claim 72 in which the spot sizes of the laser spots from the laser output pulses of the first and second lasers are the same.

74. The method of claim 72 in which the spot sizes of the laser spots from the laser output pulses of the first and second lasers are different.

75. The method of claim 72 in which the lasers are different types of lasers.

76. The method of claim 72 in which the lasers are the same type of laser.

77. The method of claim 52, further comprising:
performing an etch process to remove the selected electrically conductive links spatially aligned depthwise with removed regions of the overlying passivation layer.

78. A method of selectively removing a passivation material overlying electrically conductive redundant memory or integrated circuit links having associated link structures, each link having a link width and being positioned between an associated pair of electrically conductive contacts in a circuit fabricated on either a substrate or an optional underlying passivation layer between the electrically conductive link and the substrate, the substrate and any optional underlying passivation layer as associated with the link structures being characterized by respective laser damage thresholds, comprising:

providing to a beam positioner beam positioning data representing one or more locations of electrically conductive links, the beam positioner in response to the beam positioning data imparting relative movement of a laser spot position to the substrate;

generating for each selected link structure a set of two or more time-displaced laser output pulses, each of the laser output pulses in the set characterized by a laser spot having a spot size and energy characteristics at the laser spot position, the spot size being larger than the link width and the energy characteristics being below the respective laser damage thresholds of any underlying passivation layer and the substrate and insufficient to sever the link, and at least two of the laser pulses in the set having different spot sizes; and coordinating laser output pulse generation and the relative movement imparted by the beam positioner such that the relative movement is substantially continuous while the laser output pulses in the set sequentially strike the overlying passivation layer above the selected link structure so that the laser spot of each laser output pulse in the set encompasses the link width and the set removes the overlying passivation layer above the electrically conductive link without causing damage to any underlying passivation layer and the substrate.

79. A method of selectively removing a passivation material overlying electrically conductive redundant memory or integrated circuit links having associated link structures, each link having a link width and being positioned between an associated pair of electrically conductive contacts in a circuit fabricated on either a substrate or an optional underlying passivation layer between the electrically conductive link and the substrate, the substrate and any optional underlying passivation layer as associated with the link structures being characterized by respective laser damage thresholds, comprising:

providing to a beam positioner beam positioning data representing one or more locations of electrically conductive links, the beam positioner in response to the beam positioning data imparting relative movement of a laser spot position to the substrate;

generating for each selected link structure a set of two or more time-displaced laser output pulses, each of the laser output pulses in the set characterized by a laser spot having a spot size and energy characteristics at the laser spot position, the spot size being larger than the link width and the energy characteristics being below the respective laser damage thresholds of any underlying passivation layer and the substrate and insufficient to sever the link, and at least two of the laser output pulses in the set are generated by different types of lasers; and coordinating laser output pulse generation and the relative movement imparted by the beam positioner such that the relative movement is substantially continuous while the laser output pulses in the set sequentially strike the overlying passivation layer above the selected link structure so that the laser spot of each laser output pulse in the set encompasses the link width and the set removes the overlying passivation layer above the electrically conductive link without causing damage to any underlying passivation layer and the substrate.

* * * * *

UNITED STATES PATENT AND TRADEMARK OFFICE
CERTIFICATE OF CORRECTION

PATENT NO. : 6,887,804 B2
DATED : May 3, 2005
INVENTOR(S) : Yunlong Sun, Robert F. Hainsey and Lei Sun It is certified that error appears in the above-identified patent and that said Letters Patent is hereby corrected as shown below:

Column 1,
Line 20, delete "a" between "employing" and "one".

Column 2,
Line 12, after "2C is" delete "period" before "a";
Line 19, delete "comma" after "1.3 um"

Column 5,
Line 39, delete "a" between "of" and "conventional";
Line 41, delete "a" between "by" and "prior";
Line 54, delete "period" after "3B".

Column 7,
Line 23, insert -- of -- between "removal" and "a".

Column 9,
Line 17, change "person" to -- persons --;
Line 19, delete "period" after "pulse widths";
Line 58, delete "for" between "110" and "that".

Column 11,
Line 2, after "10", change "Ps" to -- ps --.

Column 12,
Line 3, delete "and" between "50" and "of";
Line 13, delete "period" after "11A-11C";
Line 14, delete "an" before "exemplary laser pulses";
Line 53, insert -- hyphen -- between "well" and "controllable".

Column 13,
Line 8, insert -- as -- between "such" and "aluminum".

Column 14,
Line 24, insert -- in which -- between "claim 1" and "the pulse width";
Line 25, before "is" change "pulses" to -- output pulse --;
Lines 56-57, insert -- of -- between "each" and "the laser".

UNITED STATES PATENT AND TRADEMARK OFFICE
CERTIFICATE OF CORRECTION

PATENT NO. : 6,887,804 B2
DATED : May 3, 2005
INVENTOR(S) : Yunlong Sun, Robert F. Hainsey and Lei Sun It is certified that error appears in the above-identified patent and that said Letters Patent is hereby corrected as shown below:

Column 16,
Line 17, between "layer" and "and", change "," to -- semi-colon --;
Line 35, change "suicide" to -- silicide --.

Column 17,
Line 4, change "electricafly" to -- electrically --;
Line 21, delete "of" between "distribution" and "that is";
Line 34, change "pass ivation" to -- passivation --;
Line 48, change "urn" to -- nm --;
Line 63, change "suicide" to -- silicide --.

Column 18,
Line 14, change "ampli&" to -- amplify --;
Line 66, insert -- and 30 -- between "femtoseconds" and "nanoseconds".

Column 19,
Line 23, change "claims" to -- claim --;
Lines 46-47, insert -- of -- between "each" and "the laser spots".

Signed and Sealed this

Twenty-fifth Day of April, 2006

JON W. DUDAS
*Director of the United States Patent and Trademark Office*